(12) United States Patent
Ohmae et al.

(10) Patent No.: US 12,341,231 B2
(45) Date of Patent: Jun. 24, 2025

(54) FILTER DEVICE

(71) Applicant: Murata Manufacturing Co., Ltd., Kyoto (JP)

(72) Inventors: Yuki Ohmae, Kyoto (JP); Wataru Takahashi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 282 days.

(21) Appl. No.: 18/164,849

(22) Filed: Feb. 6, 2023

(65) Prior Publication Data
US 2023/0253946 A1    Aug. 10, 2023

(30) Foreign Application Priority Data

Feb. 7, 2022  (JP) .................. 2022-017008
Sep. 30, 2022  (JP) .................. 2022-157810

(51) Int. Cl.
| | | |
|---|---|---|
| H01P 1/203 | (2006.01) | |
| H01F 27/28 | (2006.01) | |
| H01G 4/012 | (2006.01) | |
| H01G 4/30 | (2006.01) | |
| H01P 3/08 | (2006.01) | |
| H03H 7/01 | (2006.01) | |

(52) U.S. Cl.
CPC ..... *H01P 1/20345* (2013.01); *H01F 27/2804* (2013.01); *H01G 4/012* (2013.01); *H01G 4/30* (2013.01); *H01P 3/082* (2013.01); *H01P 3/088* (2013.01); *H03H 7/0115* (2013.01); *H01F 2027/2809* (2013.01); *H03H 7/0161* (2013.01)

(58) Field of Classification Search
CPC ...... H01P 1/20345; H01P 3/082; H01P 3/088; H03H 7/0115
USPC .................. 333/202–204, 236–238
See application file for complete search history.

(56) References Cited

U.S. PATENT DOCUMENTS

| | | | |
|---|---|---|---|
| 2001/0022545 A1 | 9/2001 | Ohashi | |
| 2010/0277255 A1* | 11/2010 | Matsushita | .............. H03H 7/09 333/175 |

FOREIGN PATENT DOCUMENTS

JP     2001-267882 A     9/2001

* cited by examiner

*Primary Examiner* — Rakesh B Patel
(74) *Attorney, Agent, or Firm* — McDonald Hopkins LLC

(57) ABSTRACT

A filter device includes a multilayer substrate, an inductor, and a first open stub. The multilayer substrate includes a first wiring layer, a second wiring layer including a first reference electrode to which a reference potential is supplied, and a plurality of first dielectric layers between the first wiring layer and the second wiring layer. The inductor has one end coupled to a first terminal and another end coupled to a second terminal. A portion of the first open stub is provided in the first wiring layer, and the first open stub has one end coupled to the one end of the inductor and another open-circuited end. When the multilayer substrate is viewed in plan view in a stacking direction, a capacitor is formed by the first reference electrode and the first open stub that mutually overlap. A resonant circuit is formed by the capacitor and the inductor.

19 Claims, 10 Drawing Sheets

FILTER DEVICE

CROSS REFERENCE TO RELATED APPLICATION

This application claims priority from Japanese Patent Application No. 2022-157810 filed on Sep. 30, 2022 and Japanese Patent Application No. 2022-017008 filed on Feb. 7, 2022. The contents of these applications are incorporated herein by reference in its entirety.

BACKGROUND ART

The present disclosure relates to a filter device.

In some surface acoustic wave filter devices, a filter input terminal and a package input electrode formed on a package are connected by an input bonding wire (refer to, for example, Japanese Unexamined Patent Application Publication No. 2001-267882 (Patent Document 1)).

BRIEF SUMMARY

In the surface acoustic wave filter device described in Patent Document 1, one end of a bonding wire for forming a stub is connected to a first common electrode in the electrically floating state, and the other end of the bonding wire is connected to the package input electrode. The bonding wire for forming a stub and the first common electrode function as an open stub. This increases the amount of attenuation of signal in an attenuation band of the surface acoustic wave filter device.

However, achieving a sufficient amount of attenuation of signal and a sufficient attenuation band can be difficult with the surface acoustic wave filter device described in Patent Document 1.

The present disclosure provides a filter device that achieves a sufficient amount of attenuation of signal and a sufficient attenuation band.

A filter device according to an aspect of the present disclosure includes a multilayer substrate, an inductor, and a first open stub. The multilayer substrate includes a first wiring layer, a second wiring layer including a first reference electrode to which a reference potential is supplied, and one or a plurality of first dielectric layers positioned between the first wiring layer and the second wiring layer. The inductor has one end coupled to a first terminal and another end coupled to a second terminal. At least a portion of the first open stub is provided in the first wiring layer, and the first open stub has one end coupled to the one end of the inductor and another open-circuited end. When the multilayer substrate is viewed in plan view in a stacking direction, a capacitor is formed by the first reference electrode and the first open stub that mutually overlap. A resonant circuit is formed by the capacitor and the inductor.

The present disclosure provides a filter device that achieves a sufficient amount of attenuation of signal and a sufficient attenuation band.

DETAILED DESCRIPTION

Figure 1:
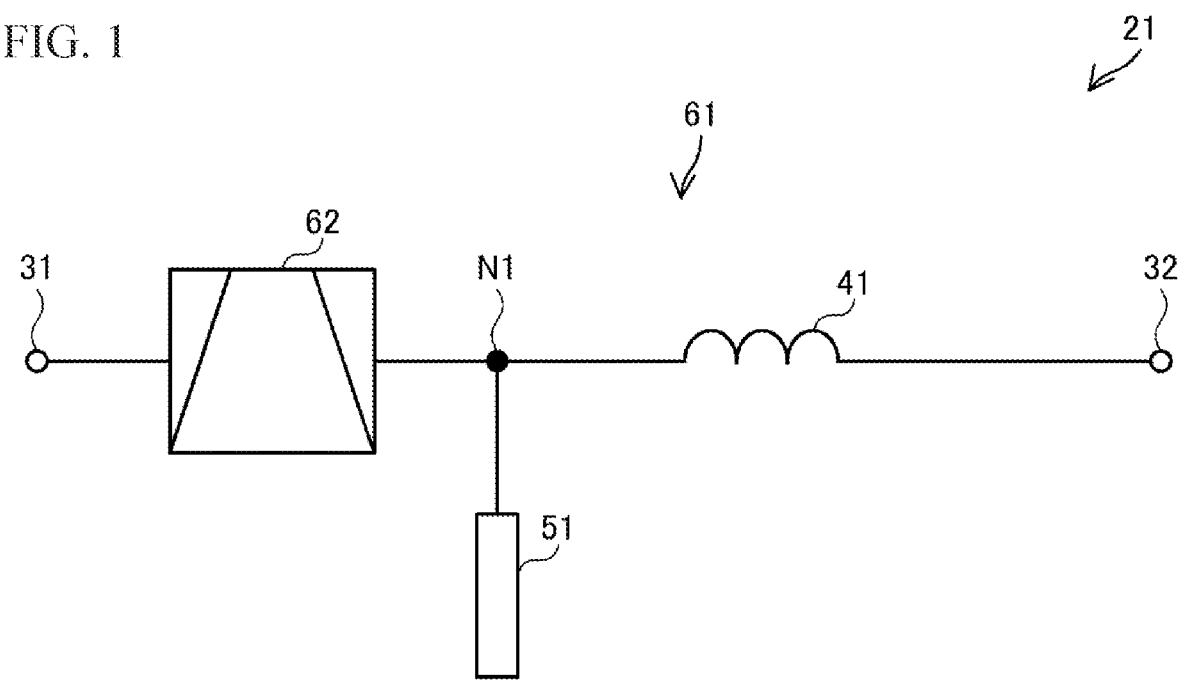
FIG. 1 is a circuit diagram of a filter circuit 21.

Hereinafter, embodiments of the present disclosure will be described in detail with reference to the drawings. It should be noted that the same elements are assigned the same reference numerals, and redundant descriptions are omitted as much as possible.

First Embodiment

Figure 2:
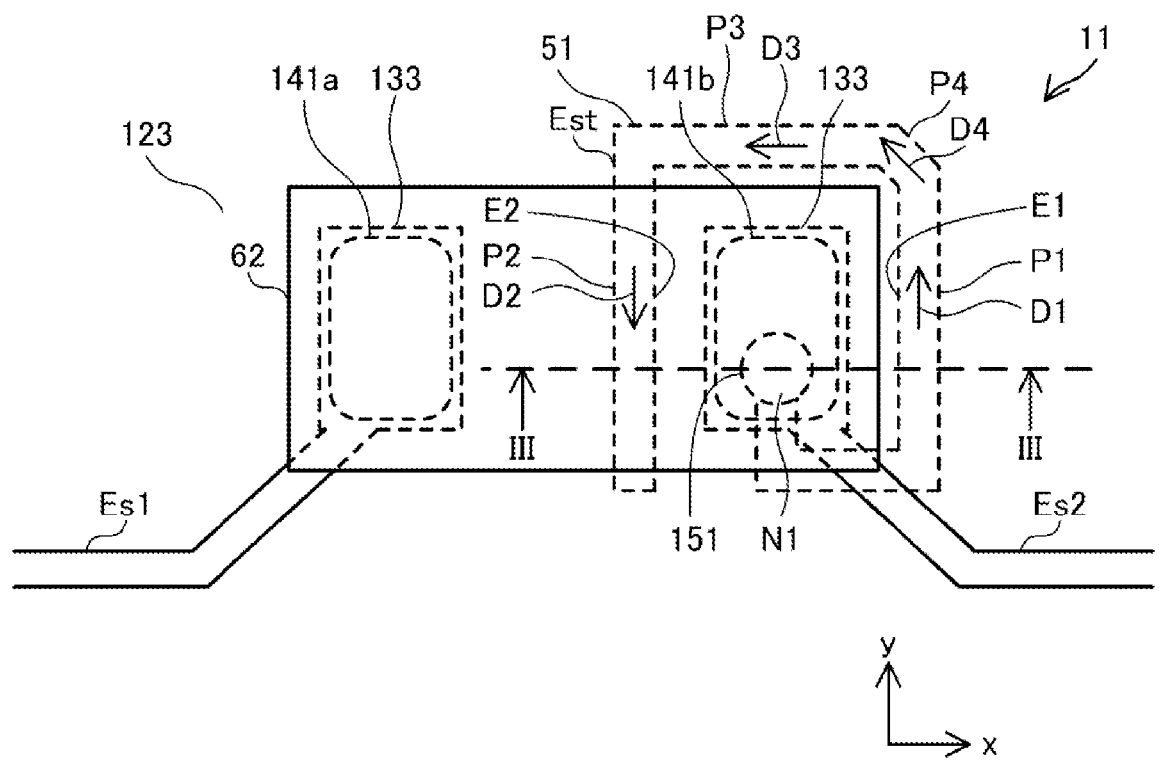
FIG. 2 is a plan view of a filter device 11 when viewed from the upper side.
Figure 3:
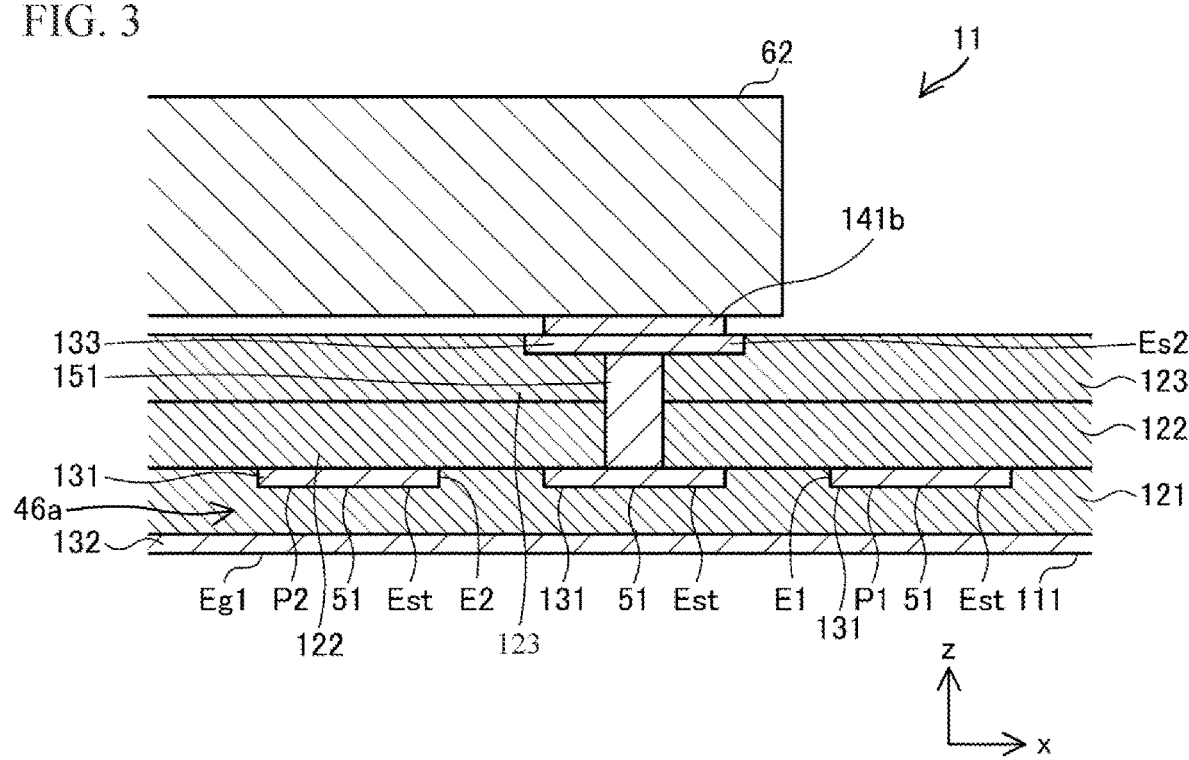
FIG. 3 is a sectional view taken along cut line III-III in FIG. 2.
Figure 4:
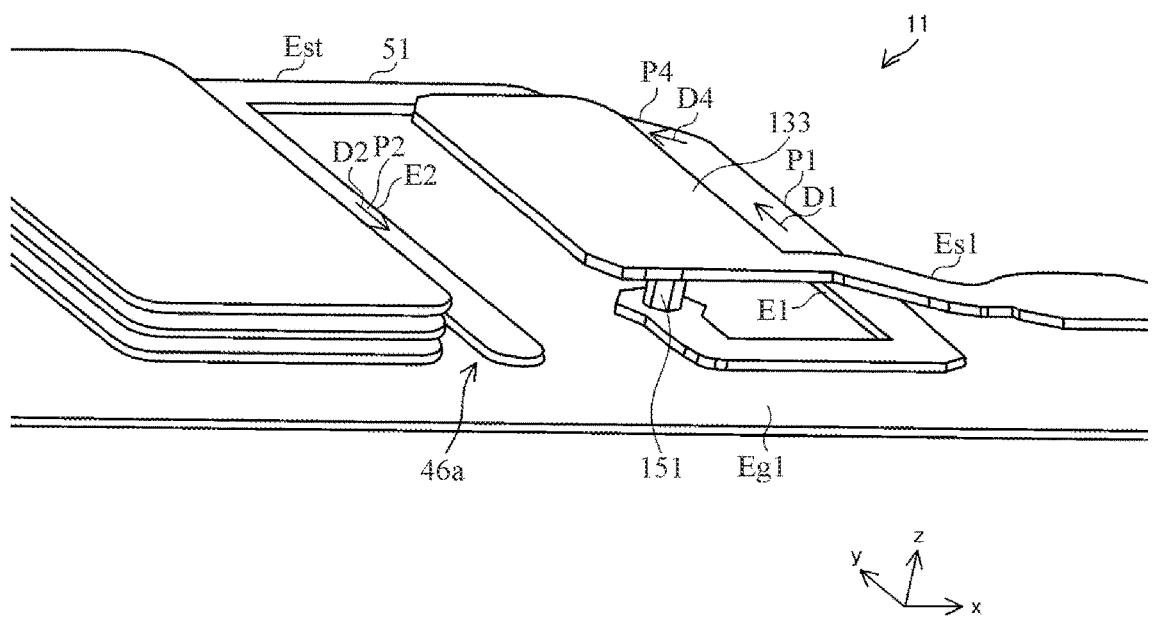
FIG. 4 is a perspective view of an open stub 51 and a portion around the open stub 51.

The following describes a filter device 11 and a filter circuit 21 according to the first embodiment. FIG. 1 is a circuit diagram of the filter circuit 21. FIG. 2 is a plan view of the filter device 11 when viewed from the upper side. FIG. 3 is a sectional view taken along cut line III-III in FIG. 2. FIG. 4 is a perspective view of an open stub 51 and a portion around the open stub 51. FIGS. 2 to 4 do not illustrate an inductor 41. FIG. 4 does not illustrate a dielectric layer.

An x axis, a y axis, and a z axis are indicated in some drawings. The x axis, the y axis, and the z axis form right-handed three-dimensional rectangular coordinates. In the following, the front side in the direction of the arrow of the x axis is sometimes referred to as the + side of the x axis, and the front side in the opposite direction of the arrow of the x axis is sometimes referred to as the − side of the x axis. The same holds for the other axes. The + side of the z axis and the − side of the z axis are sometimes respectively referred to as "upper" and "lower". The Z-axis direction is sometimes referred to as the "stacking direction". A plane perpendicular to the x axis, a plane perpendicular to the y axis, and a plane perpendicular to the z axis are sometimes respectively referred to as the yz plane, the zx plane, and the xy plane.

As illustrated in FIGS. 1 to 4, the filter circuit 21 includes a filter 61 and a component 62. The filter circuit 21 is formed as the filter device 11. The component 62 is, for example, a radio-frequency component used for radio-frequency (RF) signal. In the present embodiment, the component 62 is a filter operable as, for example, a band pass filter. The component 62 may be a filter operable as a band-elimination filter, low pass filter, or high pass filter. The component 62 may be, for example, a switch, amplifier, or matching circuit. The component 62 is, for example, a surface mount device (SMD). The component 62 is coupled between an input terminal 31 (a first terminal) and the inductor 41.

Specifically, the component 62 has one end coupled to the input terminal 31, and another end.

The filter 61 includes the inductor 41 and the open stub 51 (a first open stub). The filter 61 is a wide-band high-attenuation filter.

Specifically, the inductor 41 of the filter 61 has one end coupled to the other end of the component 62, and another end coupled to an output terminal 32 (a second terminal). The inductor 41 is, for example, an inductor element with low parasitic capacitance and low parasitic resistance, usable as an element of a lumped constant circuit. Specifically, the inductor 41 is an SMD including a wound conducting wire (not illustrated in FIGS. 2 to 4). The inductor 41 may be an element having parasitic capacitance and parasitic resistance, treated as a distributed constant circuit.

A node N1 is provided between the other end of the component 62 and the one end of the inductor 41. The open stub 51 includes a stub electrode Est (a first electrode) having one end coupled to the one end of the inductor 41 via the node N1, and another open-circuited end.

The filter device 11 includes a multilayer substrate 111, the inductor 41, the open stub 51, and the component 62.

The multilayer substrate 111 includes a metal layer 131 (a first wiring layer), a metal layer 132 (a second wiring layer), and a metal layer 133 (a third wiring layer), and a dielectric layer 121 (a first dielectric layer), a dielectric layer 122 (a second dielectric layer), and a dielectric layer 123 (refer to FIG. 3). The multilayer substrate 111 is, for example, a printed-circuit board.

The dielectric layers 121, 122, and 123 are positioned from the lower side to the upper side in the order presented. The dielectric layers 121, 122, and 123 each has a surface on the upper side of the dielectric layer, almost parallel to the xy plane (hereinafter sometimes referred to as the upper surface), and a surface on the lower side of the dielectric layer, almost parallel to the xy plane (hereinafter sometimes referred to as the lower surface). The upper surface of the dielectric layer 121 faces the lower surface of the dielectric layer 122, which is positioned on the upper side of the dielectric layer 121. The same holds for the other dielectric layer. The upper surface and the lower surface may have depressed portions and raised portions created during the manufacturing process, or a depressed portion for disposing a metal layer.

The metal layer 132 is provided on the lower side of the dielectric layer 121. The metal layer 132 includes a reference electrode Eg1 (a first reference electrode) to which a reference potential is supplied. The reference electrode Eg1 is formed, for example, over almost the entire lower surface of the dielectric layer 121. The metal layer 132 is not necessarily formed on the lower surface of the lowermost dielectric layer (the dielectric layer 121) of the multilayer substrate. For example, the metal layer 132 may be formed on the lower surface of an intermediate dielectric layer (for example, the dielectric layer 122) of the multilayer substrate.

The metal layer 131 is provided between the dielectric layers 121 and 122. The metal layer 131 includes the stub electrode Est. The distance between the metal layer 131 and the metal layer 132 including the reference electrode Eg1 is shorter than the distance between the metal layer 131 and the later described metal layer 133 having the component 62. The metal layer 133 (the third wiring layer) is provided on the upper side of the dielectric layer 123. The metal layer 133 includes electrodes Es1 and Es2. Pads 141a and 141b are provided on the upper side of the metal layer 133. The pad 141a is coupled to the input terminal 31 via the electrode Es1. The pad 141b is coupled to one end of the inductor 41 via the electrode Es2.

The component 62 is mounted on the metal layer 133 of the multilayer substrate 111 with the pads 141a and 141b interposed between the component 62 and the metal layer 133 (refer to FIGS. 2 and 3). In the present embodiment, on the upper side with respect to the multilayer substrate 111, one end of the component 62 is coupled to the pad 141a, and the other end of the component 62 is coupled to the pads 141b.

A via 151 is provided in the dielectric layers 122 and 123, extended through the dielectric layers 122 and 123 (refer to FIG. 3). An upper end portion of the via 151 is electrically coupled to the other end of the component 62 via the pad 141b. A lower end portion of the via 151 is electrically coupled to one end of the stub electrode Est.

When the multilayer substrate 111 is viewed in plan view in the stacking direction (the Z-axis direction), the stub electrode Es1 is extended from one end to the other end while the extension direction is sometimes changed (refer to FIGS. 2 and 4). The stub electrode Es1 includes a portion P1 (a first portion or third portion), the extension direction of which is a direction D1 (a first direction or second direction), and a portion P2 (a second portion), the extension direction of which is a direction D2 that is opposite to the direction D1. In the present embodiment, the direction D1 is the direction toward the + side of the y axis, and the direction D2 is the direction toward the − side of the y axis.

The length of the stub electrode Es1 is, for example, ¼ or ⅛ of the wave length of a signal at a frequency to be attenuated in a transmission line.

The stub electrode Es1 has edges E1 and E2 that face each other. Specifically, the edge E1 on the − side of the x axis of the portion P1 faces the edge E2 on the + side of the x axis of the portion P2.

When the multilayer substrate 111 is viewed in plan view in the stacking direction, at least a portion of the stub electrode Es1 overlaps the component 62 (refer to FIG. 2). For example, in the filter device 11 illustrated in FIG. 2, of the stub electrode Est, one end connected to an end portion on the − side of the y axis of the via 151, a portion extended from the one end on the − side of the y axis to the + side of the x axis, and a portion extended in the direction D2 on the − side of the x axis with respect to the via 151 overlap the component 62. In FIG. 2, when the multilayer substrate 111 is viewed in plan view in the stacking direction, of the portions forming the stub electrode Est, except a lead portion extended from the lower end portion of the via 151, portions P1 to P4 do not overlap the pad 141b. However, the portions P1 to P4 may at least partially overlap the pad 141b when the multilayer substrate 111 is viewed in plan view in the stacking direction.

When the multilayer substrate 111 is viewed in plan view in the stacking direction, given that one portion is extended from one end to the other end in an extension direction, the stub electrode Es1 has the portion P4 (a fifth portion), the extension direction of which is a direction D4 (a fourth direction), between the portion P1, the extension direction of which is the direction D1, and the portion P3 (a fourth portion), the extension direction of which is a direction D3 (a third direction) almost perpendicular to the direction D1 (refer to FIGS. 2 and 4). As used herein, the direction D4 refers to a direction between the directions D1 and D3. Specifically, regarding the direction D4, the angle between a straight line in the direction D4 and a straight line in the direction D1 (for example, 45 degrees) is made smaller than the angle between a straight line in the direction D1 and a straight line in the direction D3 (for example, 90 degrees).

In the present embodiment, given that the direction toward the + side of the y axis points at 12 o'clock when viewed from the upper side, the direction D4 points at 10:30. This means that at one corner of the stub electrode Est, the outer and inner edges are cut off. In the description of the present embodiment, the corner is linearly cut off; however, the corner of the stub electrode Es1 may be curvilinearly cut off.

When the multilayer substrate 111 is viewed in plan view in the stacking direction, the reference electrode Eg1 overlaps the stub electrode Es1 (refer to FIG. 4). The reference electrode Eg1 and the stub electrode Es1 face each other and form a capacitor 46a. The capacitor 46a formed in this manner and the inductor 41 further form a resonant circuit.

Effects

Figure 5:
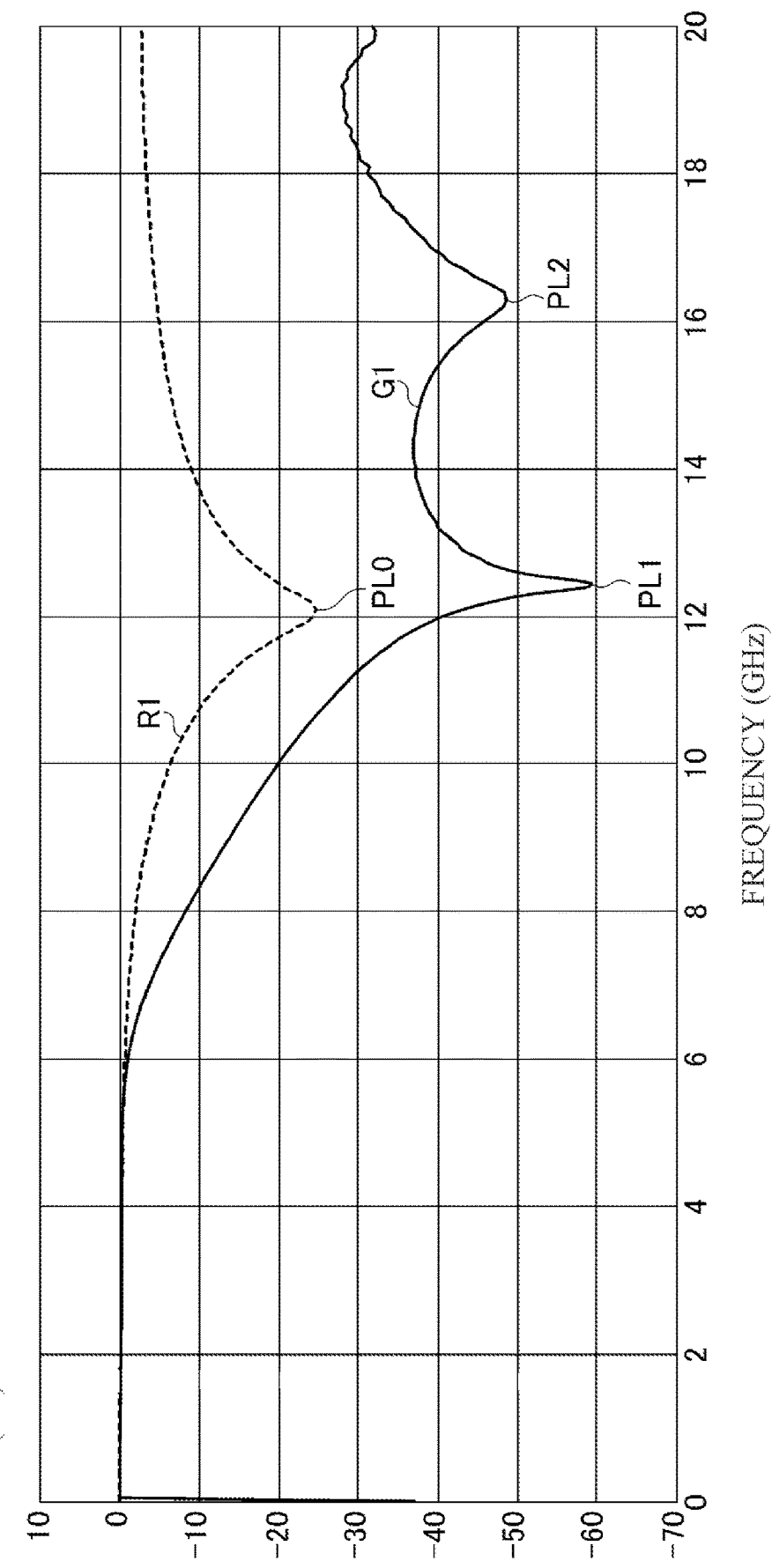
FIG. 5 illustrates an example of the attenuation characteristic of a filter 61.

FIG. 5 illustrates an example of the attenuation characteristic of the filter 61. In FIG. 5, the horizontal axis indicates frequency in units of "GHz", and the vertical axis indicates loss in units of "dB".

A curved line R1 represents the attenuation characteristic of an example of the filter 61 without necessarily the inductor 41. A pole PL0 is formed around 12 GHz by the open stub 51. However, because the amount of attenuation is relatively small, and the attenuation band is relatively narrow, this example is considered undesirable.

A curved line G1 represents the attenuation characteristic of the filter 61 of the present embodiment. A pole PL1 is formed around 12.5 GHz by the open stub 51. The amount of attenuation at the pole PL1 is the sum of the amount of attenuation at the pole caused by the open stub 51 and the amount of attenuation caused by the resonant circuit composed of the capacitor 46a and the inductor 41 described later. As a result, the amount of attenuation at the pole PL1 is larger than the amount of attenuation at the pole PL0. Additionally, the resonant circuit composed of the capacitor 46a, which is formed by the reference electrode Eg1 and the open stub 51, and the inductor 41 form a pole PL2 around 16.5 GHz. As such, the attenuation characteristic with a relatively large amount of attenuation and a wide attenuation band is achieved.

Moreover, because the open stub 51 also functions as the shunt-connected capacitor 46a, an LC resonant circuit is formed without necessarily additionally mounting, for example, an SMD serving as the capacitor 46a. This configuration reduces the number of components, and as a result, the filter is implemented with a reduced space and low costs.

Changing the length from one end to the other end of the open stub 51 changes the frequency at which the pole PL1 is formed. Changing the inductance of the inductor 41 changes the frequency at which the pole PL2 is formed. As a result, the frequencies and bandwidth for attenuation are freely configured, which facilitates design of the filter 61.

Second Embodiment

The following describes a filter device 12 according to a second embodiment. In the second and subsequent embodiments, descriptions of specifics common to the first embodiment are not repeated, and only different points will be explained. In particular, the same effects and advantages achieved by the same configurations are not mentioned in every embodiment.

Figure 6:
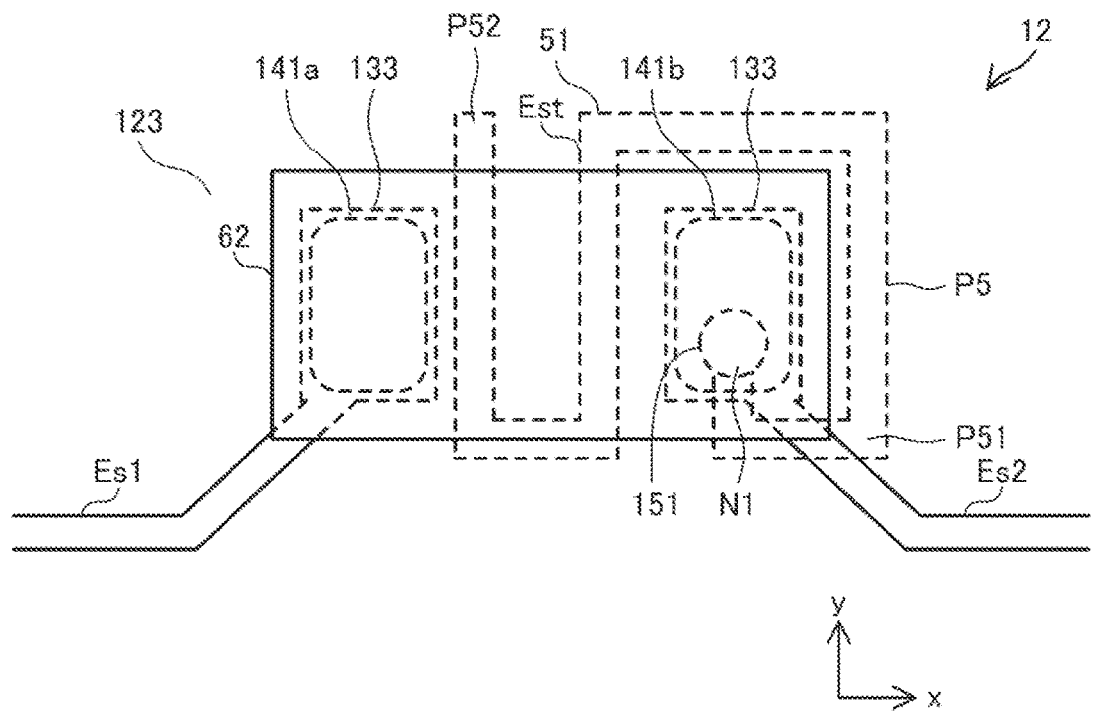
FIG. 6 is a plan view of a filter device 12 when the filter device 12 is viewed from the upper side.

FIG. 6 is a plan view of the filter device 12 having the filter circuit 21 when the filter device 12 is viewed from the upper side. As illustrated in FIG. 6, the filter device 12 according to the second embodiment differs from the filter device 11 according to the first embodiment in that the pattern of the stub electrode Es1 is shaped differently.

When the multilayer substrate 111 is viewed in plan view in the stacking direction, the open stub 51 includes a portion P5 (the third portion) extended from one end to the other end while winding.

In the present embodiment, from a position P51 to a position P52, the stub electrode Es1 is entirely extended toward the − side of the x axis, while changing the extension direction to the + side of the y axis or the − side of the y axis.

Third Embodiment

Figure 7:
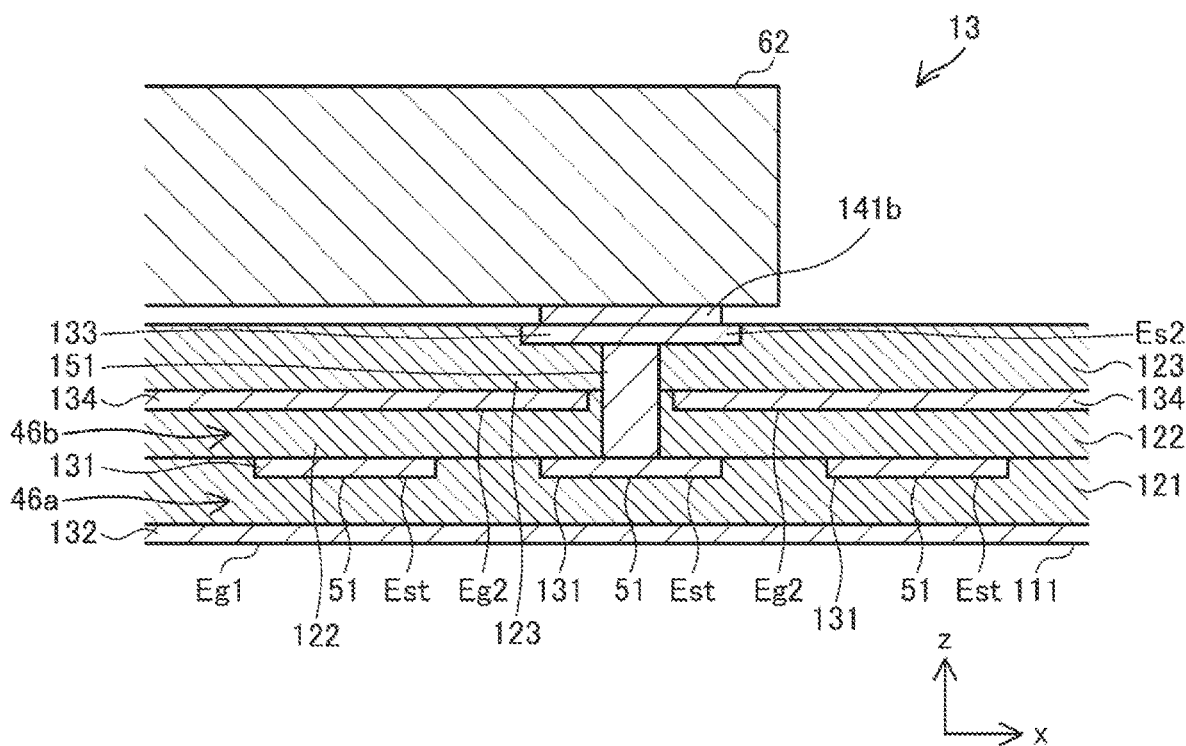
FIG. 7 schematically illustrates a section of a filter device 13, parallel to a zx plane.

The following describes a filter device 13 according to a third embodiment. FIG. 7 schematically illustrates a section of the filter device 13 having the filter circuit 21, parallel to the zx plane. The sectional view in FIG. 7 is taken along the same cut line as cut line III-III illustrated in FIG. 3.

As illustrated in FIG. 7, the filter device 13 according to the third embodiment differs from the filter device 11 according to the first embodiment in that the stub electrode Es1 is provided between two reference electrodes.

In the filter device 13, a metal layer 134 (a fourth wiring layer) is provided between the dielectric layers 122 and 123. The metal layer 134 includes a reference electrode Eg2 (a second reference electrode) to which a reference potential is supplied. The reference electrode Eg2 is formed on, for example, the lower surface of the dielectric layer 123, covering a wide area without necessarily contact with the via 151.

As a result, the metal layer 131 is between the metal layers 134 and 132. The dielectric layer 122 (the second dielectric layer) is between the metal layers 134 and 131. The dielectric layer 121 is between the metal layers 131 and 132.

Between the metal layers 131 and 134, two or more dielectric layers may be provided.

Fourth Embodiment

Figure 8:
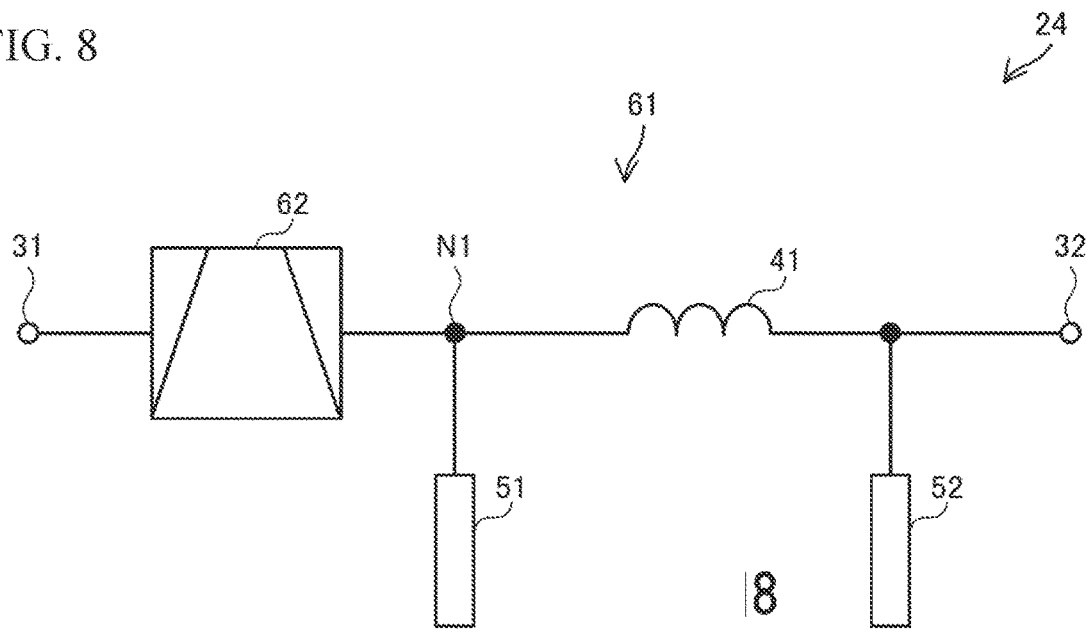
FIG. 8 is a circuit diagram of a filter circuit 24.

The following describes a filter circuit 24 according to a fourth embodiment. FIG. 8 is a circuit diagram of the filter circuit 24. As illustrated in FIG. 8, the filter circuit 24 according to the fourth embodiment differs from the filter circuit 21 according to the first embodiment in that an open stub 52 is additionally provided.

As compared with the filter circuit 21 illustrated in FIG. 1, the filter circuit 24 further includes the open stub 52 (a second open stub). The filter circuit 24 is formed in, for example, the filter device 11, 12, or 13.

The open stub 52 includes a second electrode having one end coupled to the other end of the inductor 41, and another open-circuited end. The length of the second electrode is different from the length of the stub electrode Est.

The shape of the second electrode may be the same as or different from the shape of the stub electrode Est.

By making the length of the stub electrode Es1 of the open stub 51 different from the length of the second electrode of the open stub 52 as described above, the frequency at which a pole is formed by the open stub 51 is configured differently from the frequency at which a pole is formed by the open stub 52. As a result, the filter 61 achieves the attenuation characteristic with a wider band.

Fifth Embodiment

Figure 9:
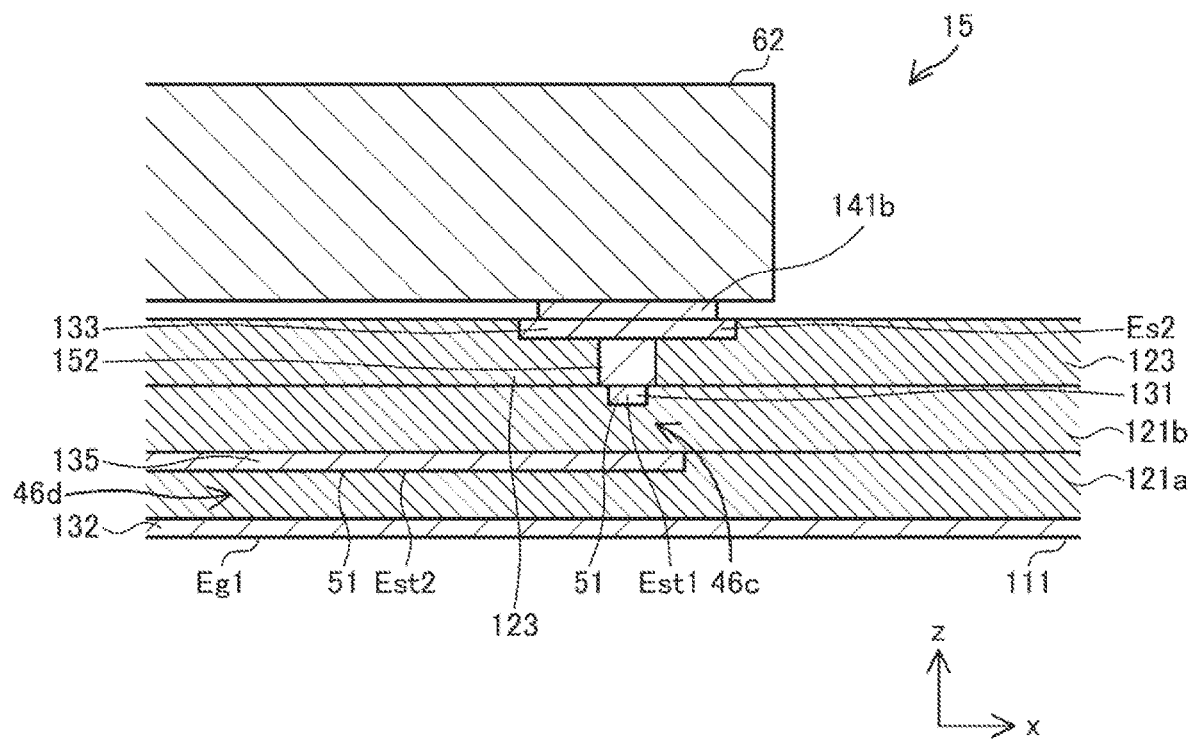
FIG. 9 schematically illustrates a section of a filter device 15 having the filter circuit 21, parallel to the zx plane.
Figure 10:
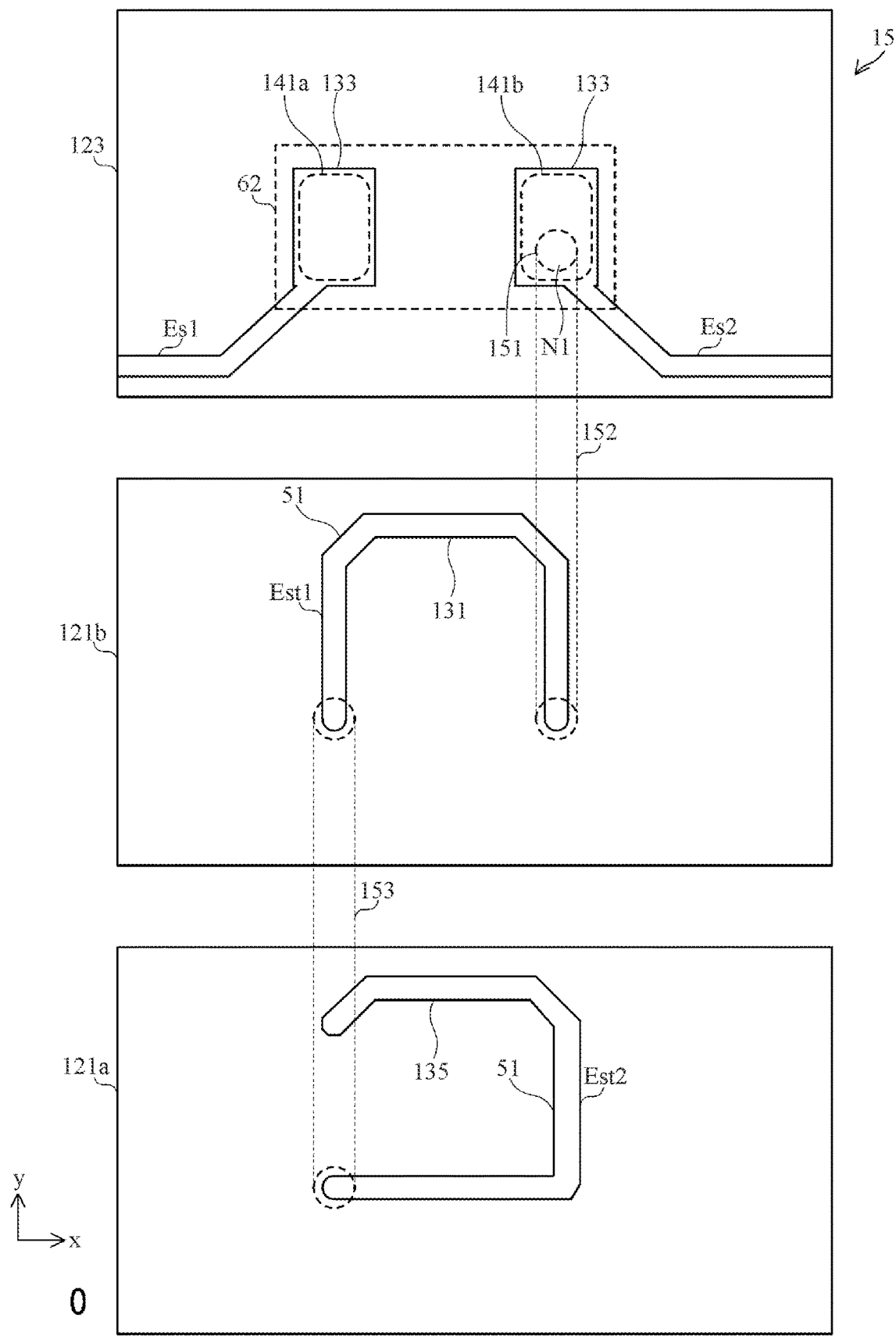
FIG. 10 provides plan views of metal layers of the filter device 15 having the filter circuit 21 when each metal layer is viewed form the upper side.

The following describes a filter device 15 according to a fifth embodiment. FIG. 9 schematically illustrates a section of the filter device 15 having the filter circuit 21, parallel to the zx plane. FIG. 10 provides plan views of the respective metal layers of the filter device 15 having the filter circuit 21 when each metal layer is viewed form the upper side. The sectional view in FIG. 9 is taken along the same cut line as cut line III-III illustrated in FIG. 3.

As illustrated in FIGS. 9 and 10, the filter device 15 according to the fifth embodiment differs from the filter device 11 according to the first embodiment in that the pattern of a stub electrode is formed across two metal layers.

In the filter device 15, the multilayer substrate 111 includes the metal layer 131 (the first wiring layer), the metal layer 132 (the second wiring layer), and a metal layer 135 (a fifth wiring layer), and a dielectric layer 121a (the first dielectric layer), a dielectric layer 121b (the first dielectric layer), and the dielectric layer 123.

The dielectric layers 121a, 121b, and 123 are positioned from the lower side to the upper side in the order presented. The metal layer 135 is provided between the dielectric layers 121a and 121b. The metal layer 131 is provided between the dielectric layers 121b and 123.

The open stub 51 is formed by a stub electrode Est1 (a sixth portion) and a stub electrode Est2 (a seventh portion) that are respectively formed in two adjacent metal layers of the metal layers included in the multilayer substrate 111.

For example, the open stub 51 is formed by the stub electrode Est1 included in the metal layer 131 formed between the dielectric layers 121b and 123 and the stub electrode Est2 included in the metal layer 135 formed between the dielectric layers 121a and 121b.

Specifically, the stub electrodes Est1 and Est2 are connected to each other by a via 153. The stub electrodes Est1 and Est2 construct a spiral conductor with more than one turn.

For example, in FIG. 10, the stub electrode Est1 is a U-shaped electrode extended from one end coupled to the electrode Es2 by a via 152 to the other end, firstly toward the + side of the y axis, secondly toward the − side of the x axis, and lastly toward the − side of the y axis. The stub electrode Est2 is a U-shaped electrode extended from one end coupled to the stub electrode Est1 by the via 153 to the other end, firstly toward the + side of the x axis, secondly toward the + side of the y axis, and lastly toward the − side of the x axis. The width of the stub electrode Est1 is almost the same as the width of the stub electrode Est2. When the multilayer substrate 111 is viewed in plan view in the stacking direction, a portion of the stub electrode Est1 overlaps a portion of the stub electrode Est2. The entire portion of the stub electrode Est1 may overlap a portion or the entire portion of the stub electrode Est2, or a portion of the stub electrode Est1 may overlap the entire portion of the stub electrode Est2.

Figure 11:
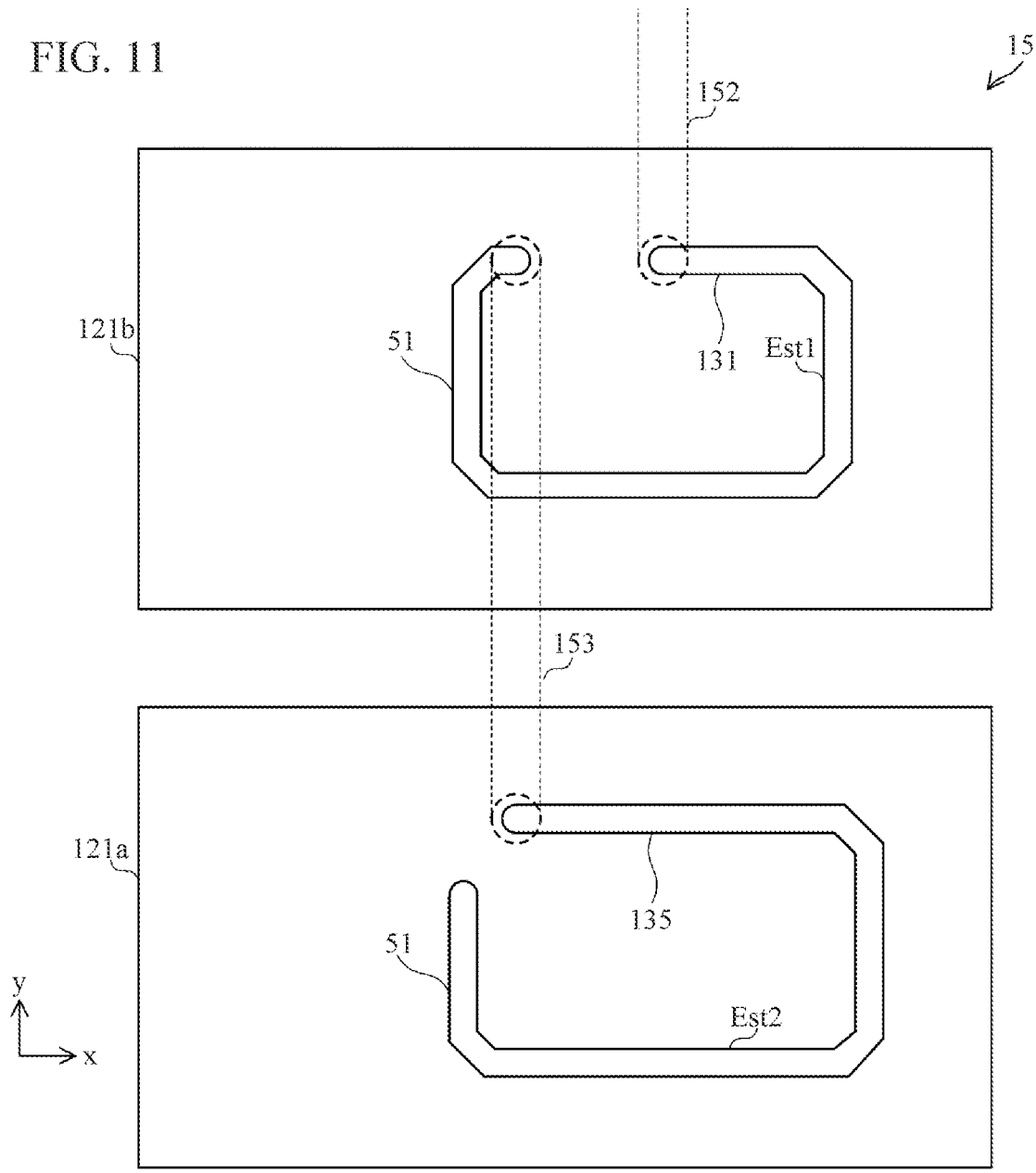
FIG. 11 illustrates a modification of the patterns of stub electrodes Est1 and Est2 illustrated in FIG. 10.

FIG. 11 illustrates a modification of the patterns of the stub electrodes Est1 and Est2 illustrated in FIG. 10. FIG. 11 does not illustrate the metal layer 133.

In FIG. 11, the stub electrode Est1 is an electrode extended from one end coupled to the electrode Es2 by the via 152 to the other end, firstly toward the + side of the x axis, secondly toward the − side of the y axis, thirdly toward the − side of the x axis, fourthly toward the + side of the y axis, and lastly toward the + side of the x axis; the stub electrode Est1 is a rectangular electrode with a cutout. The stub electrode Est2 is an electrode extended from one end coupled to the other end of the stub electrode Est1 by the via 153 to the other end, firstly toward the + side of the x axis, secondly toward the − side of the y axis, thirdly toward the − side of the x axis, and lastly toward the + side of the y axis; the stub electrode Est2 is a rectangular electrode with a cutout. The width of the stub electrode Est1 is almost the same as the width of the stub electrode Est2. When the multilayer substrate 111 is viewed in plan view in the stacking direction, a portion of the stub electrode Est1 overlaps a portion of the stub electrode Est2.

Figure 12:
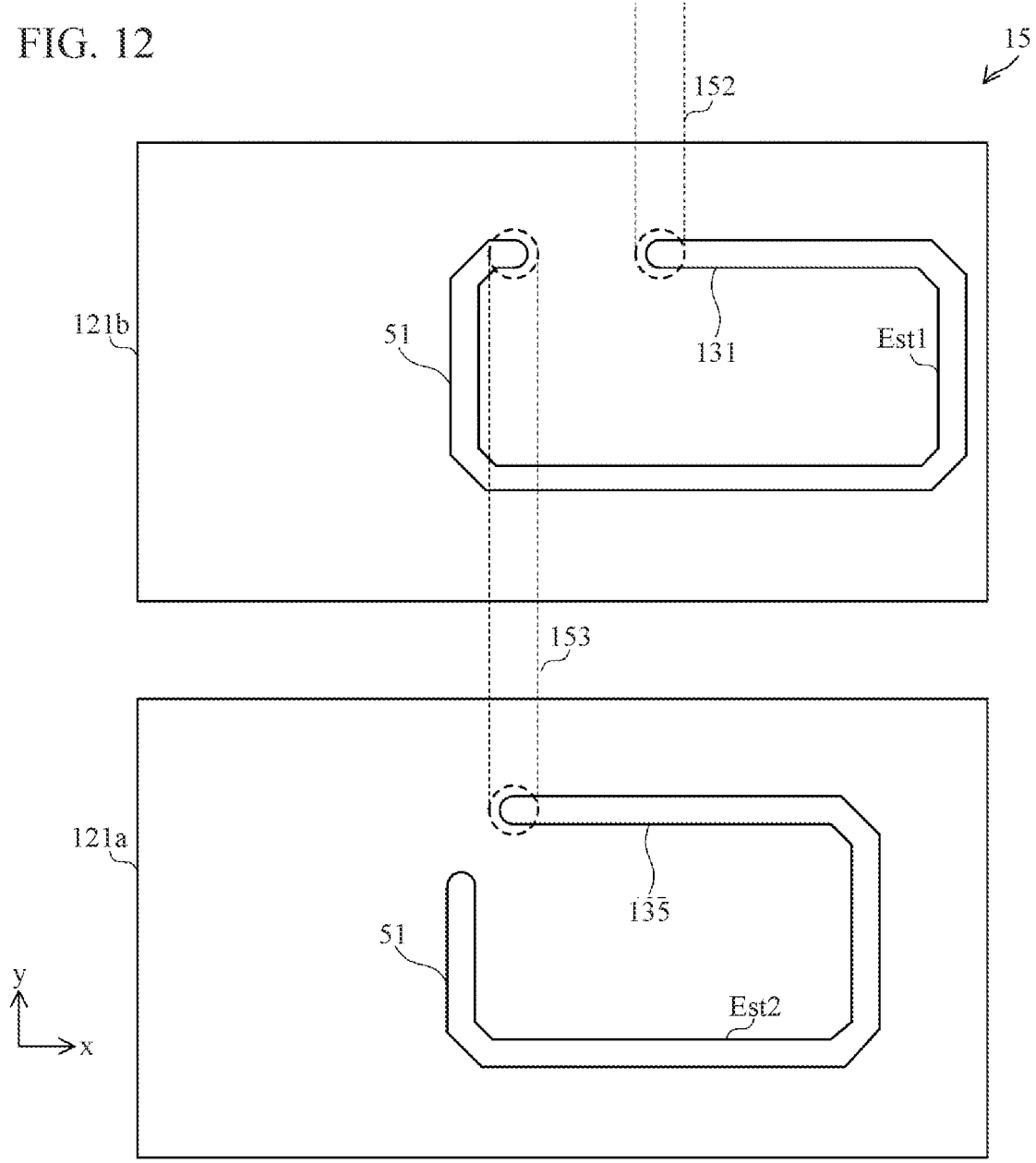
FIG. 12 illustrates a modification of the pattern of the stub electrode Est1 illustrated in FIG. 11.
Figure 13:
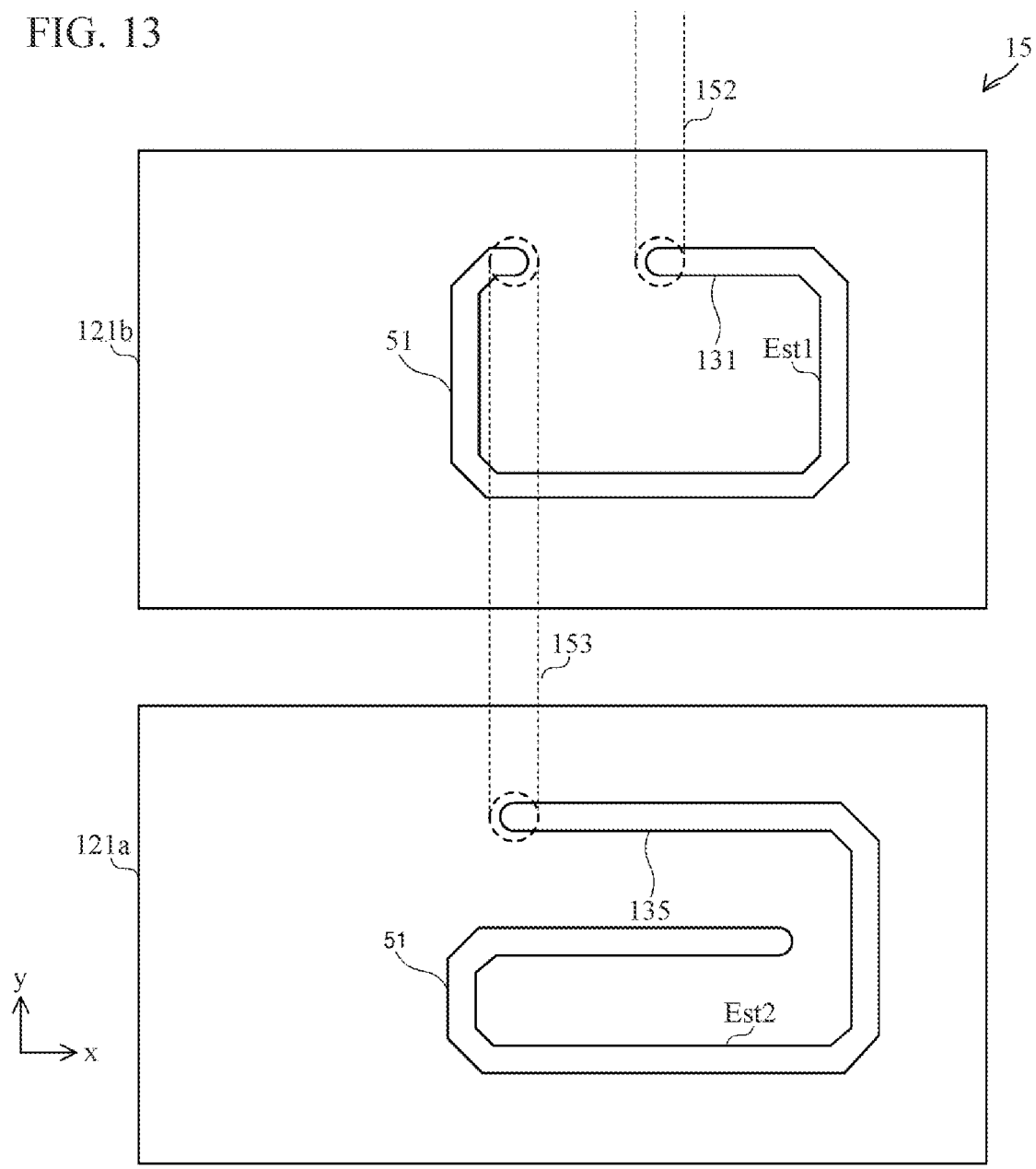
FIG. 13 illustrates a modification of the pattern of the stub electrode Est2 illustrated in FIG. 11.

FIG. 12 illustrates a modification of the pattern of the stub electrode Est1 illustrated in FIG. 11. FIG. 13 illustrates a modification of the pattern of the stub electrode Est2 illustrated in FIG. 11. FIGS. 12 and 13 do not illustrate the metal layer 133.

In FIG. 12, the stub electrode Est1 has a shape formed by extending the stub electrode Est1 illustrated in FIG. 11 in the x-axis direction, and thus, the electrode length is increased.

By contrast, in FIG. 13, the stub electrode Est2 has a shape with more than one turn, and thus, the electrode length is increased as compared to the stub electrode Est2 illustrated in FIG. 11.

Figure 14:
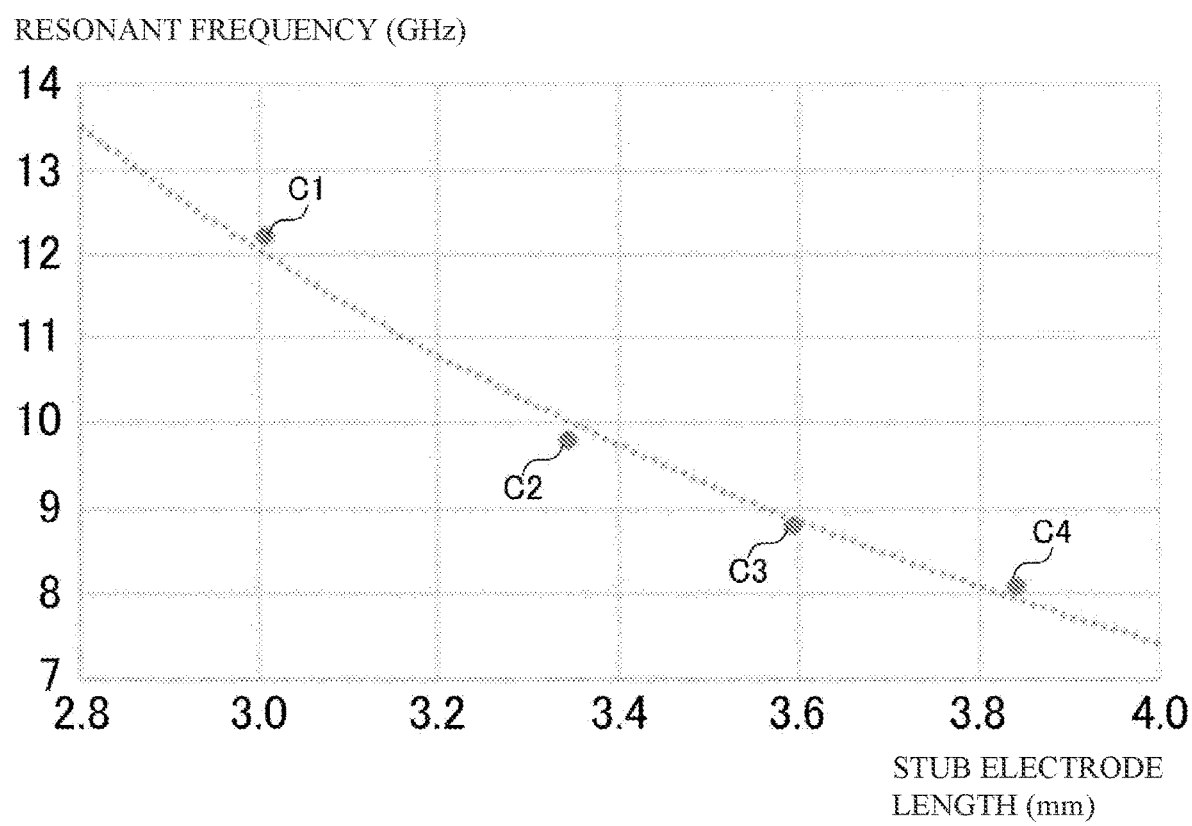
FIG. 14 illustrates an example of changes in resonant frequency versus stub electrode length of the filter 61 of the filter device 15.

FIG. 14 illustrates an example of changes in resonant frequency versus stub electrode length of the filter 61 of the filter device 15. In FIG. 14, the horizontal axis indicates electrode length of the open stub 51 in units of "mm", and the vertical axis indicates resonant frequency of a resonant circuit in units of "GHz". The resonant circuit consists of a capacitor 46c formed by the reference electrode Eg1 and the stub electrode Est1, a capacitor 46d formed by the reference electrode Eg1 and the stub electrode Est2, and the inductor 41. Points C1 to C4 respectively indicate the relationship between stub electrode length and resonant frequency in the cases of using the different open stubs 51 illustrated in FIGS. 10 to 13.

By constructing the open stub 51 from a plurality of stub electrodes formed across a plurality of metal layers, the electrode length of the open stub 51 can be increased in the multilayer substrate 111 with efficient use of the lower-side space below the component 62. As a result, as illustrated in FIG. 14, the resonant frequency of the resonant circuit is decreased as compared to the filter devices according to the first to fourth embodiments, thereby implementing filter devices that can cover lower frequency bands.

In the descriptions of the filter devices 11, 12, and 13, one dielectric layer 121 is provided between the metal layers 131 and 132, but this is not to be interpreted as limiting. Between the metal layers 131 and 132, two or more dielectric layers may be provided.

In the descriptions of the filter devices 11, 12, and 13, the component 62 is coupled between the input terminal 31 and the inductor 41, but this is not to be interpreted as limiting. The component 62 may be coupled between the output terminal 32 and the inductor 41.

In the descriptions of the filter devices 11, 12, and 13, the open stub 51 includes the stub electrode Est, but this is not to be interpreted as limiting. The open stub 51 may include the via 151.

In the description of the filter device 15, the reference electrode Eg1, the stub electrode Est2, the stub electrode Est1, and the electrode Es2 are positioned from the lower side to the upper side in the order presented, but this is not to be interpreted as limiting. The reference electrode Eg1, the stub electrode Est1, the stub electrode Est2, and the electrode Es2 may be positioned from the lower side to the upper side in the order presented.

In the description of the filter device 15, the stub electrodes Est1 and Est2 are individually formed in two adjacent metal layers, but this is not to be interpreted as limiting. The stub electrodes Est1 and Est2 may be individually formed in two metal layers that are not adjacent to each other.

In the description of the filter device 15, the dielectric layers 121a and 121b are positioned between the metal layers 131 and 132, but this is not to be interpreted as limiting. Between the metal layers 131 and 132, three or more dielectric layers may be provided.

The exemplary embodiments of the present disclosure have been described above. In the filter devices 11, 12, and 13, the multilayer substrate 111 includes the metal layer 131, the metal layer 132 having the reference electrode Eg1 to which the reference potential is supplied, and one or a plurality of dielectric layers positioned between the metal layers 131 and 132. The inductor 41 has one end coupled to the input terminal 31 and another end coupled to the output terminal 32. At least a portion of the open stub 51 is provided in the metal layer 131, and the open stub 51 has one end coupled to the one end of the inductor 41 and another open-circuited end. When the multilayer substrate 111 is viewed in plan view in the stacking direction, the reference electrode Eg1 overlaps the open stub 51. The capacitor 46a formed by the reference electrode Eg1 and the open stub 51, and the inductor 41 form a resonant circuit.

With this configuration, the pole PL1 is formed by the open stub 51 in the attenuation characteristic. Additionally, the resonant circuit composed of the capacitor 46a, which is formed by the reference electrode Eg1 and the open stub 51, and the inductor 41 form the pole PL2. As such, the attenuation characteristic with a relatively large amount of attenuation and a wide attenuation band is achieved. As a result, it is possible to provide a filter device that achieves a sufficient amount of attenuation of signal and a sufficient attenuation band.

In the filter devices 11, 12, and 13, the inductor 41 is a wound conducting wire.

Because this configuration increases the inductance of the inductor 41, it is possible to easily secure the amount of attenuation and the attenuation band.

In the filter devices 11, 12, and 13, the component 62 is coupled between the input terminal 31 or the output terminal 32, and the inductor 41.

This configuration enables the open stub 51 to be located near the component 62, which is often configured with, for example, a 50 ohm characteristic impedance. This facilitates design of the resonant circuit.

In the filter devices 11, 12, and 13, the component 62 is mounted on the metal layer 133, which is different from the metal layers 131 and 132 in the multilayer substrate 111.

With this configuration, the metal layer 131 is formed as a metal layer different from the metal layer 133, and as a result, the distance between the metal layers 131 and 132 is easily reduced. Accordingly, the capacitance of the capacitor 46a formed by the reference electrode Eg1 in the metal layer 132 and the open stub 51 in the metal layer 131 is easily increased, and it is possible to easily secure the amount of attenuation and the attenuation band.

In the filter devices 11, 12, and 13, the distance between the metal layers 131 and 132 is longer than the distance between the metal layers 131 and 133.

With this configuration, the capacitance of the capacitor 46a formed by the open stub 51 in the metal layer 131 and the reference electrode Eg1 in the metal layer 132 is easily increased, and it is possible to easily secure the amount of attenuation and the attenuation band.

In the filter devices 11, 12, and 13, when the multilayer substrate 111 is viewed in plan view in the stacking direction, the open stub 51 is extended from one end to the other end while the extension direction is sometimes changed.

This structure easily reduces the area occupied by the open stub 51 in the plan view. As a result, the flexibility in positioning the open stub 51 in the multilayer substrate 111 is enhanced, and this facilitates design.

In the filter devices 11, 12, and 13, the open stub 51 has the portion P1, the extension direction of which is the direction D1, and the portion P2, the extension direction of which is the direction opposite to the direction D1.

With this structure, the open stub 51 is shaped in a form extended similarly to a hairpin. Thus, when viewed in the plan view, the ratio of length to width of the rectangular region including the open stub 51 is made close to 1. As a result, the flexibility in positioning the open stub 51 in the multilayer substrate 111 is enhanced, and this facilitates design.

In the filter devices 11 and 12, the open stub 51 has the edges E1 and E2 that face each other.

This structure makes the direction of the magnetic field created by signals transferred in the portion P1 having the edge E1 opposite to the direction of the magnetic field created by signals transferred in the portion P2 having the edge E2. As a result, the magnetic fields created by signals flowing in the open stub 51 become weaker, so that the effects of the magnetic fields on other components are reduced.

In the filter devices 11, 12, and 13, the component 62 is coupled between the input terminal 31 or the output terminal 32, and the inductor 41. When the multilayer substrate 111 is viewed in plan view in the stacking direction, at least a portion of the open stub 51 overlaps the component 62.

The component 62 for RF signal is usually of a large size. When the component 62 is mounted on the multilayer substrate 111, the lower-side space below the component 62 can be efficiently used. With the structure described above, at least a portion of the open stub 51 is provided in the space, and as a result, the size of the filter devices 11, 12, and 13 is effectively reduced.

In the filter device 12, when the multilayer substrate 111 is viewed in plan view in the stacking direction, the open stub 51 includes the portion P5, which is extended from one end to the other end while winding.

With this structure, while elongating the open stub 51, the ratio of length to width of the rectangular region including the open stub 51 is made close to 1. As a result, the flexibility in positioning the open stub 51 in the multilayer substrate 111 and the flexibility in length of the open stub 51 are both enhanced, and this further facilitates design.

In the filter device 11, when the multilayer substrate 111 is viewed in plan view in the stacking direction, the open stub 51 is extended from one end to the other end while the extension direction is sometimes changed; and between the portion P1 (the third portion), the extension direction of which is the direction D1 (the second direction), and the portion P3 (the fourth portion), the extension direction of which is the direction D3 (the third direction) almost perpendicular to the direction D1, the open stub 51 has the portion P4 (the fifth portion), the extension direction of which is the direction D4 (the fourth direction) between the directions D1 and D3.

The corners of the open stub 51 often reflect RF signals very strongly. Because this reflection of RF signals can cause noise, it is considered undesirable. With the structure described above, a corner of the open stub 51 is cut off, and as a result, it is possible to suppress strong reflection of RF signal. As such, noise generation is suppressed, and it is possible to provide the filter device 11 with a favorable noise characteristic.

In the filter devices 11, 12, and 13, the component 62 is a filter.

This configuration further increases the amount of attenuation and attenuation band of the filter devices 11, 12, and 13, and as a result, it is possible to provide the filter devices 11, 12, and 13 with high attenuation and wide band coverage.

In the filter device 13, the metal layer 134 includes the reference electrode Eg2 to which a reference potential is supplied. The metal layer 131 is between the metal layers 134 and 132. The dielectric layer 122 is between the metal layers 134 and 131.

With this structure, in addition to the capacitor 46a formed by the reference electrode Eg1 and the open stub 51, a capacitor 46b is formed by the reference electrode Eg2 and the open stub 51. As a result, capacitance is increased without necessarily enlarging the area of the open stub 51. In particular, large capacitance is often needed for low-frequency signals. Hence, it is possible to provide the filter device 13 with a favorable attenuation characteristic with respect to low-frequency signals.

In the filter devices 11, 12, and 13, the open stub 52 has one end coupled to the other end of the inductor 41 and another open-circuited end; and the length of the open stub 52 is different from the length of the open stub 51.

By making the length of the open stub 51 different from the length of the open stub 52 as described above, the frequency at which a pole is formed by the open stub 51 is configured differently from the frequency at which a pole is formed by the open stub 52. As a result, it is possible to provide the filter devices 11, 12, and 13 with wider-band attenuation characteristics.

In the filter device 15, the multilayer substrate 111 further includes the metal layer 135. The open stub 51 includes the stub electrode Est1 provided in the metal layer 131 and the stub electrode Est2 provided in the metal layer 135.

The structure in which the open stub 51 is formed across two metal layers enhances the flexibility in positioning the stub electrode and consequently increases the flexibility of design of the filter device 15.

In the filter device 15, when the multilayer substrate 111 is viewed in plan view in the stacking direction, at least a portion of the stub electrode Est1 overlaps at least a portion of the stub electrode Est2.

This structure reduces the area occupied by the open stub 51 when the multilayer substrate 111 is viewed in plan view in the stacking direction. As such, in the multilayer substrate 111, it is possible to increase the length of the open stub 51 without necessarily extending the open stub 51 perpendicularly to the stacking direction.

In the filter device 15, the stub electrodes Est1 and Est2 construct a spiral conductor with more than one turn.

This structure increases the length of the open stub 51 without necessarily enlarging the area occupied by the open stub 51 when the multilayer substrate 111 is viewed in plan view in the stacking direction.

In the filter device 15, the dielectric layers 121a and 121b are positioned between the metal layers 131 and 132. The metal layer 135 is positioned between the dielectric layers 121a and 121b.

As such, the metal layers 131 and 135 are positioned adjacent to each other, and the metal layers 131 and 135 are positioned near the metal layer 132. This makes the distance between the open stub 51 and the reference electrode Eg1 short. As a result, the capacitance of the capacitor formed by the open stub 51 and the reference electrode Eg1 mutually overlapping becomes large. As such, it is possible to easily secure the amount of attenuation and the attenuation band. Additionally, it is possible to reduce the space occupied by the capacitor.

In the filter devices 11, 12, and 13, one dielectric layer 121 is provided between the metal layers 131 and 132.

This structure easily reduces the distance between the metal layers 131 and 132, and as a result, the capacitance of the capacitor 46a formed by the reference electrode Eg1 in the metal layer 132 and the open stub 51 in the metal layer 131 is increased. As such, it is possible to easily secure the amount of attenuation and the attenuation band.

The embodiments described above have been made for ease of understanding the present disclosure and should not be interpreted as limiting. The present disclosure may be changed or improved without necessarily departing from its spirit, and the present disclosure also includes equivalents thereof. This means that modifications to the embodiments designed by those skilled in the art as appropriate are also embodied in the scope of the present disclosure when the modifications have features of the present disclosure. For example, the elements included in the embodiments, the arrangements thereof, materials, conditions, shapes, sizes are not limited to the examples and may be changed as appropriate. The embodiments described above are mere examples, and as might be expected, the configurations described in the different embodiments may be partially replaced or combined with each other. These modifications are embraced within the scope of the present disclosure when these modifications contain the attributes of the present disclosure.

What is claimed is:

1. A filter device comprising:
   a multilayer substrate comprising:
      a first wiring layer,
      a second wiring layer comprising a first reference electrode to which a reference potential is supplied, and
      at least one first dielectric layer positioned between the first wiring layer and the second wiring layer;
   an inductor having a first end coupled to a first terminal and a second end coupled to a second terminal; and
   a first open stub, at least a portion of the first open stub being provided in the first wiring layer, the first open stub having a first end coupled to the first end of the inductor and a second open-circuited end, wherein:
   when the multilayer substrate is viewed in plan view in a stacking direction, a capacitor is formed by the first reference electrode and the first open stub that mutually overlap,
   a resonant circuit is formed by the capacitor and the inductor, and
   the second terminal is an output terminal.

2. The filter device according to claim 1, wherein the inductor is a wound conducting wire.

3. The filter device according to claim 1, further comprising:
   a circuit component coupled between the first terminal or the second terminal, and the inductor.

4. The filter device according to claim 3, wherein the circuit component is mounted on a third wiring layer of the multilayer substrate, the third wiring layer being different from the first wiring layer and the second wiring layer.

5. The filter device according to claim 4, wherein a distance between the first wiring layer and the second wiring layer is shorter than a distance between the first wiring layer and the third wiring layer.

6. The filter device according to claim 3, wherein the component is a filter.

7. The filter device according to claim 1, further comprising:
a second open stub having a first end coupled to the second end of the inductor, and a second open-circuited end, a length of the second open stub being different from a length of the first open stub.

8. The filter device according to claim 1, wherein the first open stub has edges that face each other.

9. The filter device according to claim 1, wherein the multilayer substrate further comprises:
a fourth wiring layer comprising a second reference electrode to which the reference potential is supplied, the fourth wiring layer being positioned such that the first wiring layer is between the fourth wiring layer and the second wiring layer, and
at least one second dielectric layer positioned between the fourth wiring layer and the first wiring layer.

10. The filter device according to claim 1, wherein when the multilayer substrate is viewed in plan view in the stacking direction, the first open stub comprises a third portion extended from the first end to the second end while winding.

11. The filter device according to claim 1,
wherein when the multilayer substrate is viewed in plan view in the stacking direction, a direction in which the first open stub extends from the first end to the second end varies; and
wherein the first open stub comprises a fifth portion between a third portion and a fourth portion, the extension direction of the third portion being a second direction, the extension direction of the fourth portion being a third direction almost perpendicular to the second direction, and the extension direction of the fifth portion being a fourth direction between the second direction and the third direction.

12. The filter device according to claim 1, wherein when the multilayer substrate is viewed in plan view in the stacking direction, a direction in which the first open stub extends from the first end to second end varies.

13. The filter device according to claim 12, wherein the first open stub comprises:
a first portion, the extension direction of the first portion being a first direction; and
a second portion, the extension direction of the second portion being a direction opposite to the first direction.

14. The filter device according to claim 12, further comprising:
a circuit component coupled between the first terminal or the second terminal, and the inductor,
wherein when the multilayer substrate is viewed in plan view in the stacking direction, at least a portion of the first open stub overlaps the component.

15. The filter device according to claim 1, wherein:
the multilayer substrate further comprises a fifth wiring layer, and
the first open stub comprises a sixth portion provided in the first wiring layer and a seventh portion provided in the fifth wiring layer.

16. The filter device according to claim 15, wherein when the multilayer substrate is viewed in plan view in the stacking direction, at least a portion of the sixth portion overlaps at least a portion of the seventh portion.

17. The filter device according to claim 15, wherein the sixth portion and the seventh portion construct a spiral conductor with more than one turn.

18. The filter device according to claim 15, wherein:
two first dielectric layers of the at least one first dielectric layer are positioned between the first wiring layer and the second wiring layer, and
the fifth wiring layer is positioned between one first dielectric layer and another first dielectric layer of the two first dielectric layers.

19. The filter device according to claim 1, wherein one first dielectric layer of the at least one first dielectric layer is positioned between the first wiring layer and the second wiring layer.

* * * * *

UNITED STATES PATENT AND TRADEMARK OFFICE
CERTIFICATE OF CORRECTION

PATENT NO. : 12,341,231 B2
APPLICATION NO. : 18/164849
DATED : June 24, 2025
INVENTOR(S) : Yuki Ohmae et al.

It is certified that error appears in the above-identified patent and that said Letters Patent is hereby corrected as shown below:

In the Specification

Column 4, Line 20, "electrode Es1 is" should be --electrode Est is--
Column 4, Line 22, "electrode Es1 includes" should be --electrode Est includes--
Column 4, Line 30, "electrode Es1 is," should be --electrode Est is,--
Column 4, Line 33, "electrode Es1 has" should be --electrode Est has--
Column 4, Line 39, "electrode Es1 overlaps" should be --electrode Est overlaps--
Column 4, Line 57, "electrode Es1 has" should be --electrode Est has--
Column 5, Line 9, "electrode Es1 may" should be --electrode Est may--
Column 5, Line 13, "electrode Es1 (refer" should be --electrode Est (refer--
Column 5, Line 14, "electrode Es1 face" should be --electrode Est face--
Column 6, Line 6, "electrode Es1 is" should be --electrode Est is--
Column 6, Line 12, "electrode Es1 is" should be --electrode Est is--
Column 6, Line 27, "Es1 is provided" should be --Est is provided--
Column 6, Line 61, "electrode Es1 of" should be --electrode Est of--

Signed and Sealed this
Nineteenth Day of August, 2025

Coke Morgan Stewart
*Acting Director of the United States Patent and Trademark Office*